United States Patent
Shishido et al.

[11] Patent Number: 6,064,106
[45] Date of Patent: *May 16, 2000

[54] BIPOLAR TRANSISTOR HAVING ISOLATION REGIONS

[75] Inventors: Norihiko Shishido, Yokohama; Sanae Yoshino, Chiba-ken, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/971,467

[22] Filed: Nov. 17, 1997

Related U.S. Application Data

[63] Continuation of application No. 08/648,954, May 16, 1996, abandoned.

[30] Foreign Application Priority Data

May 22, 1995 [JP] Japan .................................. 7-122215

[51] Int. Cl.[7] .................................. H01L 29/00
[52] U.S. Cl. ..................... 257/513; 257/526; 257/517; 257/520; 257/565
[58] Field of Search ..................... 257/513, 514, 257/517, 526, 520, 565; 438/424, 426, 430, 361, 353, 359, 425, 294, 295, 296, 297

[56] References Cited

U.S. PATENT DOCUMENTS

| | | | |
|---|---|---|---|
| 4,228,450 | 10/1980 | Anantha et al. | 257/540 |
| 4,470,062 | 9/1984 | Muramatsu | 257/513 |
| 4,502,913 | 3/1985 | Lechaton et al. | 257/513 |
| 4,551,743 | 11/1985 | Murakami | 257/513 |
| 4,639,288 | 1/1987 | Price et al. | 438/430 |
| 4,660,068 | 4/1987 | Sakuma et al. | 257/513 |
| 4,693,782 | 9/1987 | Kikuchi et al. | 257/513 |
| 4,700,456 | 10/1987 | Bruchez | 257/513 |
| 4,745,087 | 5/1988 | Iranmanesh | 438/359 |
| 4,771,328 | 9/1988 | Malaviya et al. | 257/513 |
| 4,860,085 | 8/1989 | Feygenson | 257/513 |
| 4,887,144 | 12/1989 | Cook et al. | 257/513 |
| 4,924,284 | 5/1990 | Beyer et al. | 257/513 |
| 4,965,217 | 10/1990 | Desilets et al. | 257/513 |
| 4,980,748 | 12/1990 | Hozumi et al. | 257/513 |
| 5,008,208 | 4/1991 | Liu et al. | 438/361 |
| 5,045,904 | 9/1991 | Kobayashi et al. | 257/513 |
| 5,285,101 | 2/1994 | Kikuchi | 257/593 |
| 5,360,753 | 11/1994 | Park et al. | 438/426 |
| 5,406,113 | 4/1995 | Horie | 257/565 |
| 5,677,232 | 10/1997 | Kim et al. | 438/424 |

*Primary Examiner*—Olik Chaudhuri
*Assistant Examiner*—Phat X. Cao
*Attorney, Agent, or Firm*—Finnegan, Henderson, Farabow, Garrett & Dunner, L.L.P.

[57] ABSTRACT

In an NPN transistor of this invention having a trench isolation structure, for example, an $N^+$-type buried layer and an $N^-$-type epitaxial layer are stacked on an element forming region of a $P^+$-type substrate, and a trench having polysilicon filled therein is formed in a portion adjacent to the element forming region. Further, a field oxide film is formed to extend from the trench having polysilicon filled therein over to the adjacent element isolation region without extending into the element forming region. Thus, a distance from the front end portion of the field oxide film on the element forming region side to the trench is reduced to reduce the element area. Therefore, the parasitic capacitance can be reduced and the power consumption of a circuit can be reduced.

8 Claims, 6 Drawing Sheets

BIPOLAR TRANSISTOR HAVING ISOLATION REGIONS

This application is a continuation of Ser. No. 08/648,954 filed May 16, 1996, now abandoned.

BACKGROUND OF THE INVENTION

1. Field of the Invention

This invention relates to a semiconductor device having a trench for element isolation, for example, and a method for manufacturing the same, and more particularly to an NPN transistor having a trench formed for element isolation and a method for manufacturing the same.

2. Description of the Related Art

FIGS. 13A and 13B show the schematic structure of a conventional NPN transistor having a trench formed for element isolation. FIG. 13A is a cross sectional view showing the NPN transistor and FIG. 13B is a view schematically showing a mask pattern used for forming a field oxide film (insulating film for element isolation).

Next, the manufacturing process for the NPN transistor is explained by taking the NPN transistor shown in FIG. 13A as an example.

First, an $N^+$-type buried layer 102 and an $N^-$-type epitaxial layer 103 are formed on an element forming region of a $P^+$-type substrate 101. Then, an element isolation trench 105 is formed by forming a trench in an area adjacent to the element forming region and filling polysilicon 104 in the trench.

Next, a field oxide film 106 is formed by use of a mask (resist pattern) 120 as shown in FIG. 13B.

After the field oxide film 106 is formed, polysilicon is deposited on the structure and boron is ion-implanted into the polysilicon layer. Further, a silicon oxide film is deposited on the polysilicon layer, the silicon oxide film and polysilicon layer are etched to leave portions thereof which correspond to a base electrode so as to form a base polysilicon layer 107.

Next, the thermal diffusion process is effected to form an outer base region ($P^+$) 108. Further, boron is ion-implanted with the base polysilicon layer 107 used as a mask to form an inner base region (P) 109.

Then, after a silicon oxide film is deposited, an anisotropic etching process is effected to form a side wall 110 on the inner wall of the base polysilicon layer 107.

After this, a protection film 111 is deposited and a portion of the protection film 111 which corresponds to an emitter electrode is removed by etching. Then, a polysilicon layer is deposited, arsenic is ion-implanted into the polysilicon layer and the polysilicon layer is etched to leave a portion thereof which corresponds to the emitter electrode so as to form an emitter polysilicon layer 112. Further, the thermal diffusion process is effected to form an emitter region ($N^+$) 113.

Then, after a portion of the protection film 111 which corresponds to the collector electrode is etched, a deep $N^+$-type layer 114 used as a collector region is formed.

Next, a portion of the protection film 111 which corresponds to the base electrode is removed and wiring is performed by use of aluminum, for example, and the base electrode 115, emitter electrode 116 and collector electrode 117 are formed.

By effecting the above process, an NPN transistor in which the element isolation is made by use of the trench is constructed.

However, in the above conventional NPN transistor, since the field oxide film 106 formed on the trench 105 and the element isolation region extends into the element forming region, a distance (space) is provided from the boundary portion between the trench 105 and the element forming region adjacent to the trench 105 to the front end portion of the field oxide film 106. Therefore, the element area is increased by an amount corresponding to the space to increase the parasitic capacitance (Cjs), thereby causing the current consumption to be increased when the circuit is constructed.

Thus, in the prior art, since the front end portion of the field oxide film extends out the trench and extends into the element forming region, the element area is increased by an amount corresponding to the space between the trench and the front end portion of the field oxide film, that is, an extending amount of the field oxide film to increase the parasitic capacitance and increase the current consumption in the circuit.

SUMMARY OF THE INVENTION

Accordingly, an object of this invention is to provide a semiconductor device capable of attaining the high integration density and high-speed operation, reducing the parasitic capacitance, and reducing the current consumption in the circuit by significantly reducing the element area and a method for manufacturing the same.

In order to attain the above object, a semiconductor device of this invention comprises a semiconductor substrate; an element isolation trench formed in the semiconductor substrate and having an electrically conductive material filled therein; and an insulating film for element isolation formed adjacent to the trench on an element isolation region; wherein the insulating film is formed to extend on the trench without extending onto an element forming region adjacent to the trench.

Further, a semiconductor device of this invention comprises a semiconductor substrate; an element forming region in the semiconductor substrate; an element isolation region in the semiconductor substrate; a transistor formed in the element forming region; a trench for electrically separating the element forming region from the element isolation region; an insulation film for element isolation formed to extend on the trench and formed not to extend onto the element forming region.

Further, a method for manufacturing semiconductor devices, comprising the steps of forming an element isolation trench in a semiconductor substrate; patterning a resist on an element forming region to cover part of the trench; and then forming an insulating film for element isolation on a trench forming portion and element isolation region with the resist pattern used as a mask.

In this invention, since the front end portion of the element isolation insulating film can be prevented from extending out the trench and extending into the element forming region by use of the above-described means, and as a result, formation of a space corresponding to the extension of the front end portion can be prevented, the element area can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

There will now be described embodiments of this invention with reference to the accompanying drawings.

Figure 1:
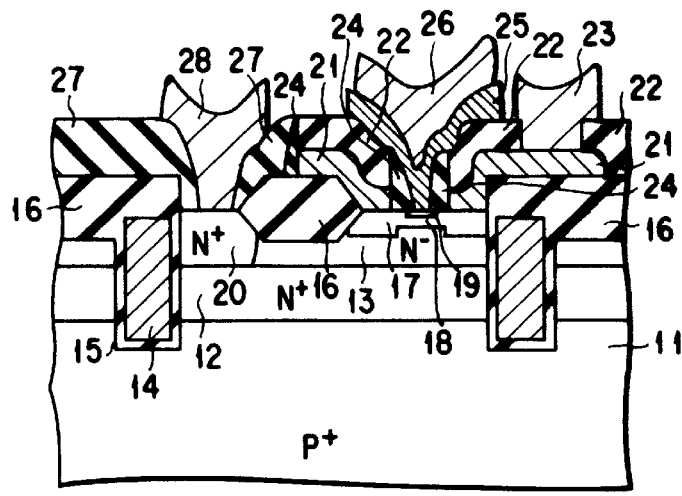
FIG. 1 is a cross sectional view schematically showing the structure of an NPN transistor according to a first embodiment of this invention.

FIG. 1 schematically shows the structure of an NPN transistor according to a first embodiment of this invention. That is, in the NPN transistor, an $N^+$-type buried layer 12 and an $N^-$-type epitaxial layer 13 are stacked on an element forming region of a $P^+$-type substrate 11. Then, an element isolation trench 15 having polysilicon 14 filled therein is formed in the outer peripheral portion of the element forming region.

Figure 5:
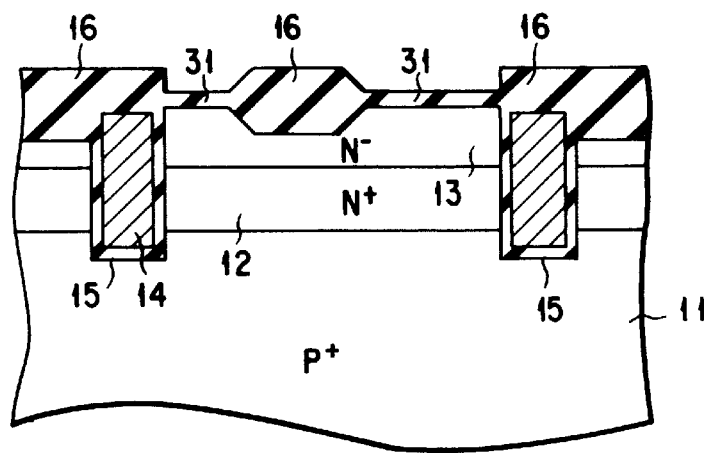
FIG. 5 is a schematic cross sectional view showing the structure of the NPN transistor of FIG. 1 in one manufacturing process.

Further, a field oxide film 16 is formed to extend from the upper portion of the trench 15 over to the element isolation region and formed on a preset portion in the element forming region. A portion of the field oxide film 16 which is formed to extend from the upper portion of the trench 15 over to the element isolation region is formed not to extend into the element forming region and terminate at a portion on the trench 15. With this structure, the front end portion of the field oxide film 16 lying on the element forming region side can be prevented from being formed to extend out the trench 15 and extend into the element forming region and will not occupy the area of the element forming region. That is, a portion of the element forming region which will be occupied by the extending potion of the field oxide film if the field oxide film 16 is formed to extend out the trench 15 and extend into the element forming region does not exist, and as a result, the element area can be reduced by an amount corresponding to the extending portion. Preferably, the field oxide film is formed to terminate on the boundary between the trench 15 and the element forming region (FIG. 5). However, it is not strictly required to terminate the field oxide film exactly on the boundary and the field oxide film may be formed to terminate at any portion on the upper portion of the trench 15.

On the surface area of the $N^-$-type epitaxial layer 13, an outer base region (for example, with a concentration of $5 \times 10^{18}$) 17, inner base region (for example, with a concentration of $1 \times 10^{17}$) 18, emitter region (for example, with a concentration of $1 \times 10^{20}$) 19, and deep $N^+$-type layer (for example, with a concentration of $5 \times 10^{19}$) 20 used as a collector region are formed.

Further, in the base electrode portion, a base polysilicon layer 21 connected to the outer base region 17 and a base electrode 23 connected to the base polysilicon layer 21 via an opening formed in a silicon oxide film 22 are formed.

In the emitter electrode portion, an emitter polysilicon layer 25 connected to the emitter region 19 via an opening defined by a side wall (insulating material) 24 which is formed on the side surfaces of the base polysilicon layer 21 and silicon oxide layer 22 and an emitter electrode 26 connected to the emitter polysilicon layer 25 are formed.

In the collector electrode portion, a collector electrode 28 connected to the deep $N^+$-type layer 20 via an opening formed in a silicon oxide film 27 is formed.

In the NPN transistor with the above structure, since the end portion of the field oxide film 16 which lies on the element forming region side is formed to terminate on the trench 15 and is not formed to extend out the trench 15 and extend into the element forming region, the element area can be reduced accordingly and the parasitic capacitance (Cjs) can be significantly reduced.

Next, a method for manufacturing the above NPN transistor is explained.

FIGS. 2 to 6 schematically show the manufacturing process for the NPN transistor according to the first embodiment.

Figure 2:
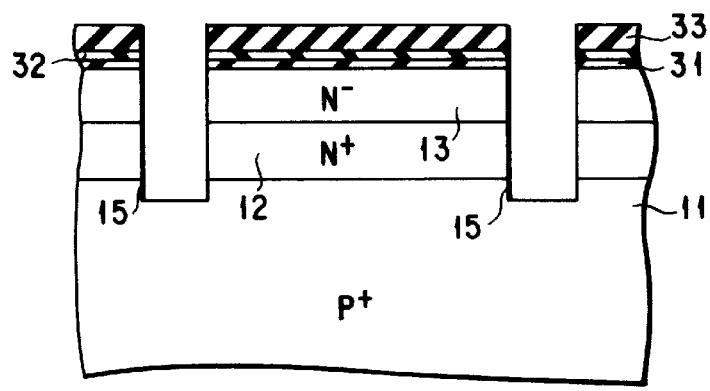
FIG. 2 is a schematic cross sectional view showing the structure of the NPN transistor of FIG. 1 in one manufacturing process.

First, an $N^+$-type buried layer 12 and $N^-$-type epitaxial layer 13 are sequentially formed on a $P^+$-type substrate 11. Further, a thermal oxidation film 31 is formed by subjecting the $P^+$-type substrate 11 to the thermal oxidation process and then an $Si_3N_4$ film 32 is deposited on the semiconductor structure. Then, after a silicon oxide film 33 is deposited, a trench 15 reaching the P⁺-type substrate 11 is formed by selectively etching those portions of the films 31, 32, 33, N⁺-type buried layer 12 and N⁻-type epitaxial layer 13 which correspond to the trench (FIG. 2).

Next, after the side wall on the opening or trench 15 is subjected to the thermal oxidation process, polysilicon 14 is deposited to fill in the opening. Then, the upper portion of the polysilicon layer 14 and the silicon oxide film 33 are etched out to make the substrate surface flat. Further, the thermal oxidation process is effected to form an additional thermal oxidation film 31 on the surface of the polysilicon layer 14.

Figure 3:
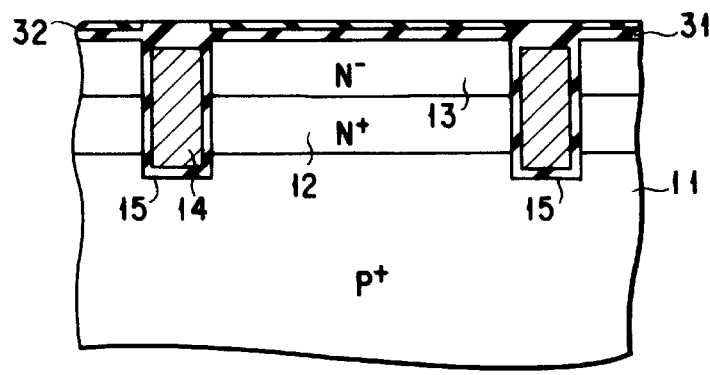
FIG. 3 is a schematic cross sectional view showing the structure of the NPN transistor of FIG. 1 in one manufacturing process.

Thus, the element region isolation trench 15 having the polysilicon layer 14 filled therein is formed (FIG. 3).

Figure 4A:
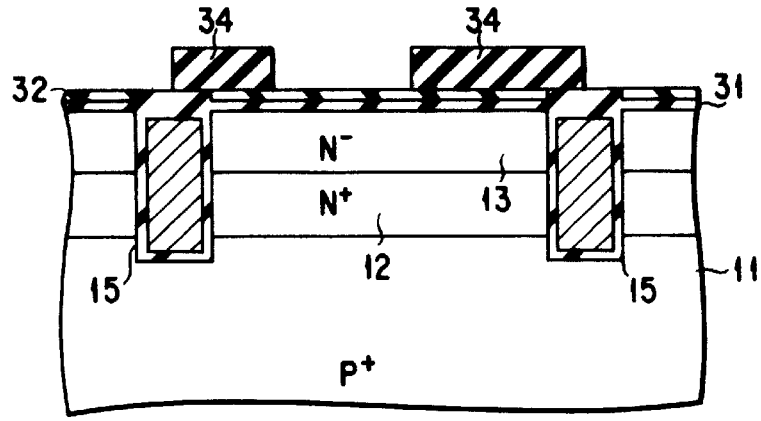
FIG. 4A is a schematic cross sectional view showing the structure of the NPN transistor of FIG. 1 in one manufacturing process.
Figure 4B:
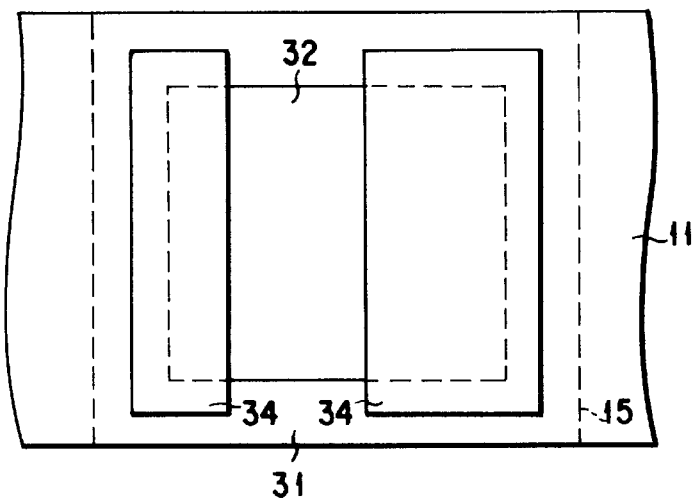
FIG. 4B is a schematic plan view showing the structure of the NPN transistor in the manufacturing process shown in FIG. 4A.

Then, a resist pattern 34 extending from the element forming region over to the trench 15 and used for forming a field oxide film 16 (FIG. 5) is formed (FIGS. 4A and 4B).

Next, after the Si₃N₄ film 32 is removed by etching with the resist pattern 34 used as a mask and the LOCOS oxidation process is effected to form a field oxide film 16 in an area extending from the upper portion of the trench 15 over to the element isolation region and on a preset portion in the element forming region (FIG. 5). A portion of the field oxide film 16 which is formed to extend from the upper portion of the trench 15 over to the element isolation region is formed not to extend into the element forming region.

Next, after the thermal oxidation film 31 left on the element forming region is removed, phosphorus is ion-implanted into the collector region and then a deep N⁺-type layer 20 (FIG. 6) is formed by effecting the thermal diffusion process.

Then, polysilicon is deposited to form a polysilicon layer, boron is ion-implanted into the polysilicon layer, and a silicon oxide film 22 is deposited. After this, the polysilicon layer 21 and silicon oxide film 22 are selectively etched to leave the portions thereof corresponding to the base electrode portion so as to form a base polysilicon layer 21.

Figure 6:
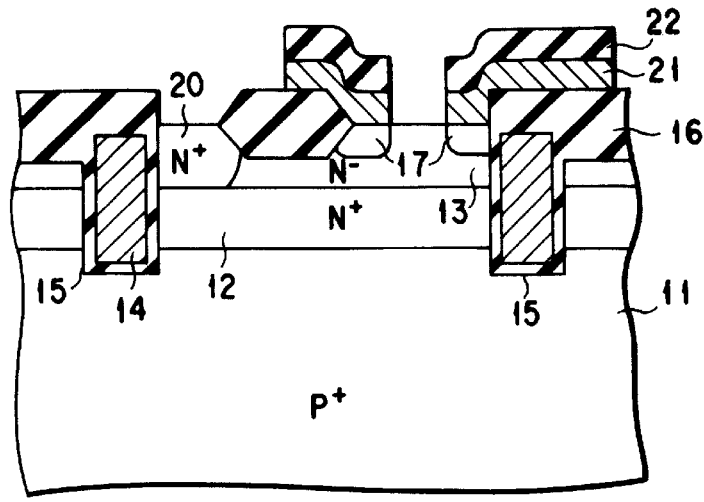
FIG. 6 is a schematic cross sectional view showing the structure of the NPN transistor of FIG. 1 in one manufacturing process.

Further, the thermal diffusion process is effected at a temperature of approx. 95° C. to diffuse boron from the base polysilicon layer 21 into the surface area of the epitaxial layer 13 so as to form an outer base region 17 in the surface area of the epitaxial layer 13 (FIG. 6).

Then, boron is ion-implanted with the base polysilicon layer 21 used as a mask to form an inner base region 18 (FIG. 1).

Further, a silicon oxide film is deposited and the silicon oxide film is etched to form a side wall 24 (FIG. 1).

Then, polysilicon is deposited to form a polysilicon layer, arsenic is ion-implanted into the polysilicon layer, and then the polysilicon layer is etched to leave the portion thereof corresponding to the emitter electrode portion so as to form an emitter polysilicon layer 25. Then, the thermal diffusion process is effected to diffuse arsenic ion in the emitter polysilicon layer 25 into the surface area of the epitaxial layer 13 so as to form an emitter region 19.

After this, a silicon oxide film 27 is deposited and a portion of the silicon oxide film 27 corresponding to the collector electrode portion is removed by etching. Then, after a portion of the silicon oxide film 22 corresponding to the base electrode portion is removed, the wiring is made by use of aluminum, for example, to form the base electrode 23, emitter electrode 26 and collector electrode 28.

Thus, the NPN transistor having a trench isolation structure as shown in FIG. 1 is manufactured.

Next, another embodiment of this invention is explained.

Figure 7:
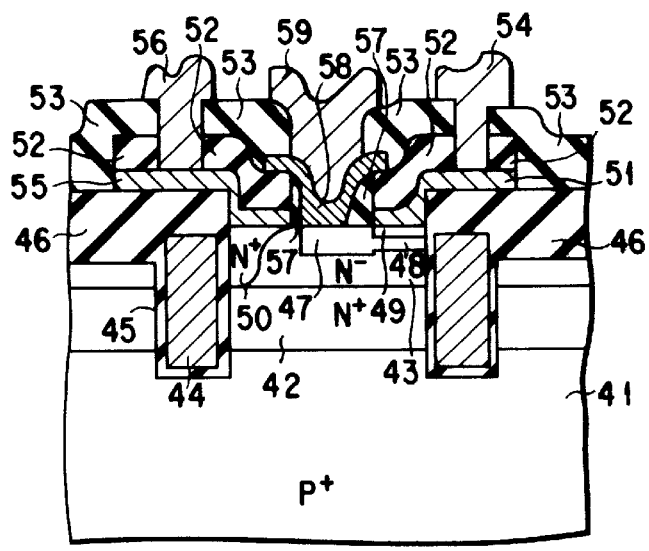
FIG. 7 is a cross sectional view schematically showing the structure of an NPN transistor according to a second embodiment of this invention.

FIG. 7 schematically shows the structure of an NPN transistor according to a second embodiment of this invention.

That is, in the above NPN transistor, an N⁺-type buried layer 42 and an N⁻-type epitaxial layer 43 are stacked on an element forming region of a P⁺-type substrate 41. Then, an element isolation trench 45 having polysilicon 44 filled therein is formed in the outer peripheral portion of the element forming region.

Further, a field oxide film 46 is formed to extend from the upper portion of the trench 45 over to the element isolation region. The field oxide film 46 which is formed to extend from the upper portion of the trench 45 over to the element isolation region is formed not to extend into the element forming region and terminate at a portion on the trench 45. With this structure, the front end portion of the field oxide film 46 lying on the element forming region side can be prevented from being formed to extend out the trench 45 and extend into the element forming region and will not occupy the area of the element forming region. That is, a portion of the element forming region which will be occupied by the extending potion of the field oxide film if the field oxide film 46 is formed to extend out the trench 45 and extend into the element forming region does not exist, and as a result, the element area can be reduced by an amount corresponding to the extending portion. Also, in this embodiment, preferably, the field oxide film is formed to terminate on the boundary between the trench 45 and the element forming region as shown in FIG. 7. However, it is not strictly required to terminate the field oxide film exactly on the boundary and the field oxide film may be formed to terminate at any portion on the upper portion of the trench 45.

On the surface area of the N⁻-type epitaxial layer 43, an outer base region (for example, with a concentration of $5 \times 10^{18}$) 47, inner base region (for example, with a concentration of $1 \times 10^{17}$) 48, emitter region (for example, with a concentration of $1 \times 10^{20}$) 49, and deep N⁺-type layer (for example, with a concentration of $5 \times 10^{19}$) 50 used as a collector region are formed.

Further, in the emitter electrode portion, an emitter polysilicon layer 51 connected to the emitter region 49 and an emitter electrode 54 connected to the emitter polysilicon layer 51 via an opening formed in a silicon oxide film 52 and protection film 53 are formed.

In the collector electrode portion, a collector polysilicon layer 55 connected to the deep N⁺-type layer 50 and a collector electrode 56 connected to the collector polysilicon layer 55 via an opening formed in the silicon oxide film 52 and protection film 53 are formed.

In the base electrode portion, a base polysilicon layer 58 connected to the outer base region 47 via an opening defined by a side wall 57 formed on the side surfaces of the collector polysilicon layer 55 and silicon oxide film 52 and the side surfaces of the emitter polysilicon layer 51 and silicon oxide film 52 is formed and a base electrode 59 connected to the base polysilicon layer 58 via an opening formed in the protection film 53 is formed.

In the NPN transistor of the second embodiment with the above structure, since the end portion of the field oxide film 46 lying on the element forming region side is formed to terminate on the trench 45 and is not formed to extend out the trench 45 and extend into the element forming region, the element area can be reduced accordingly and the parasitic capacitance (Cjs) can be significantly reduced.

Further, in the case of the element of the second embodiment, the outer base region 47 can be formed by self-alignment using the electrode portions (polysilicon layers 51, 55) of the collector and emitter as a mask.

Next, a manufacturing process for the NPN transistor according to the second embodiment is explained with reference to FIGS. 8 to 12.

First, an N$^+$-type buried layer 42 and N$^-$-type epitaxial layer 43 are sequentially formed on a P$^+$-type substrate 41. Further, a thermal oxidation film 61 is formed by subjecting the P$^+$-type substrate 41 to the thermal oxidation process and then an $Si_3N_4$ film 62 is deposited on the semiconductor structure. Then, after a silicon oxide film 63 is deposited, a trench 45 reaching the P$^+$-type substrate 41 is formed by selectively etching those portions of the films 61, 62, 63, N$^+$-type buried layer 42 and N$^-$-type epitaxial layer 43 which correspond to the trench.

Figure 8:
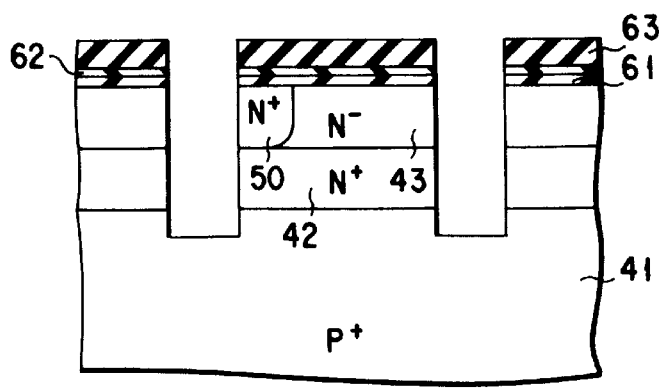
FIG. 8 is a schematic cross sectional view showing the structure of the NPN transistor of FIG. 7 in one manufacturing process.

Further, after the trench is formed, phosphorus ion is ion-implanted into only the collector region and the thermal oxidation process is effected to form a deep N$^+$-type layer 50 (FIG. 8).

Next, after the side wall on the opening or trench 15 is subjected to the thermal oxidation process, polysilicon 44 is deposited to fill in the opening. Then, the upper portion of the polysilicon layer 44 and the silicon oxide film 63 are etched out to make the substrate surface flat.

Figure 9:
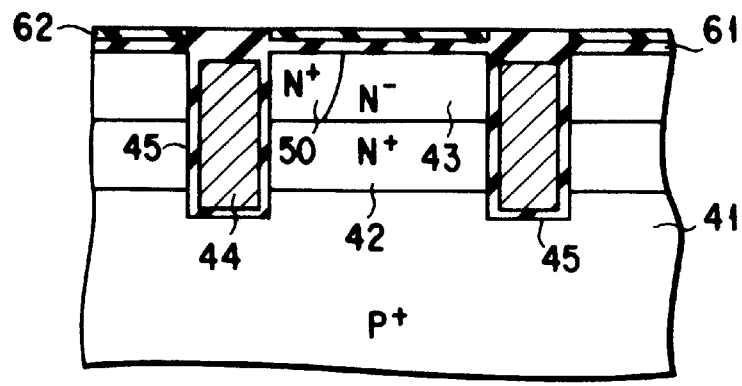
FIG. 9 is a schematic cross sectional view showing the structure of the NPN transistor of FIG. 7 in one manufacturing process.

Further, the thermal oxidation process is effected to form an additional thermal oxidation film 61 on the surface of the polysilicon layer 44, and like the case of the element of the first embodiment, the element region isolation trench 45 having the polysilicon layer 44 filled therein is formed (FIG. 9).

Figure 10A:
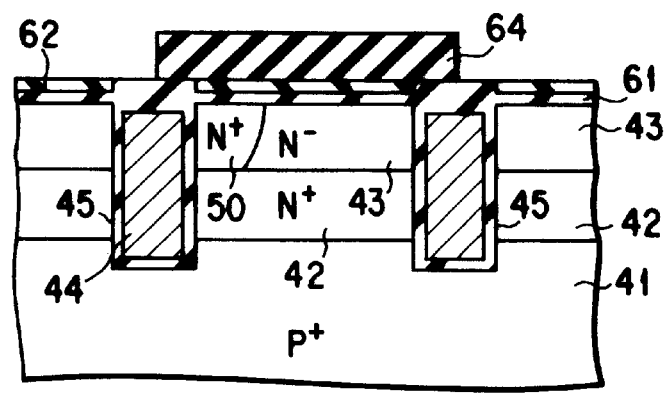
FIG. 10A is a schematic cross sectional view showing the structure of the NPN transistor of FIG. 7 in one manufacturing process.
Figure 10B:
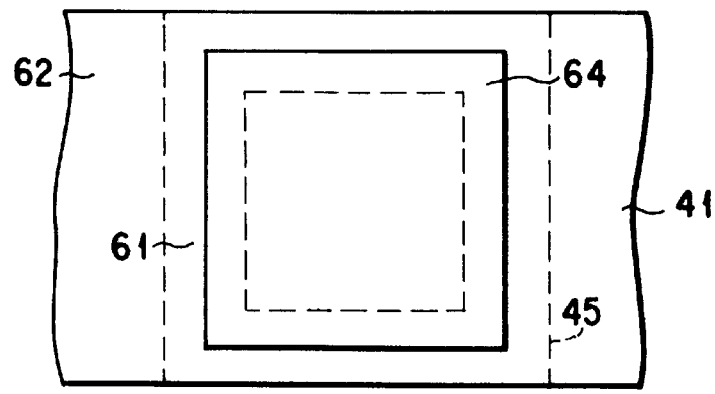
FIG. 10B is a schematic plan view showing the structure of the NPN transistor in the manufacturing process shown in FIG. 10A.

Then, a resist pattern 64 extending from the element forming region over to the trench 45 and used for forming a field oxide film 46 (FIG. 11) is formed (FIGS. 10A and 10B).

Figure 11:
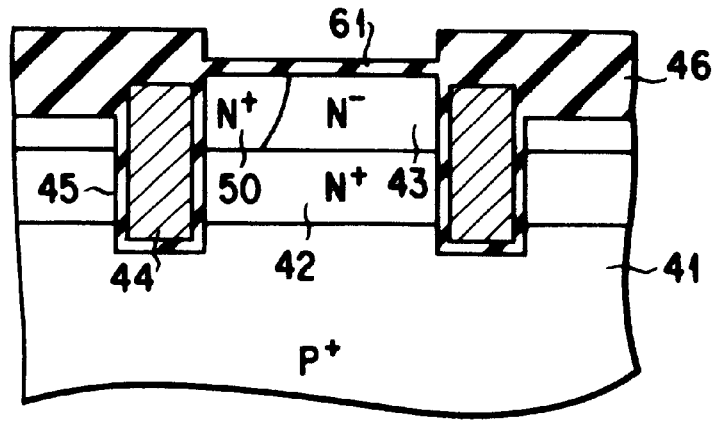
FIG. 11 is a schematic cross sectional view showing the structure of the NPN transistor of FIG. 7 in one manufacturing process.

Next, after the $Si_3N_4$ film 62 is removed by etching with the resist pattern 64 used as a mask and the LOCOS oxidation process is effected to form a field oxide film 46 in an area extending from the upper portion of the trench 45 over to the element isolation region without extending into the element forming region (FIG. 11).

Next, after the thermal oxidation film 61 left on the element forming region is removed, boron is selectively ion-implanted to form an inner base region 48.

Figure 12:
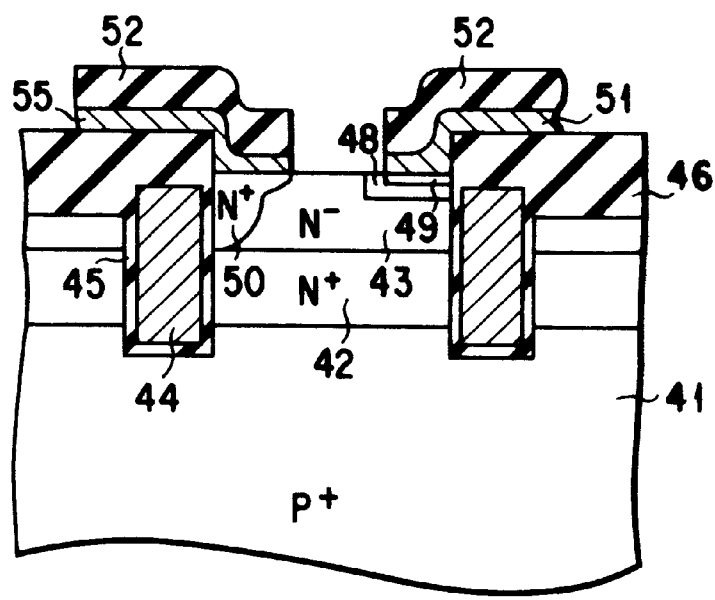
FIG. 12 is a schematic cross sectional view showing the structure of the NPN transistor of FIG. 7 in one manufacturing process.
Figure 13A:
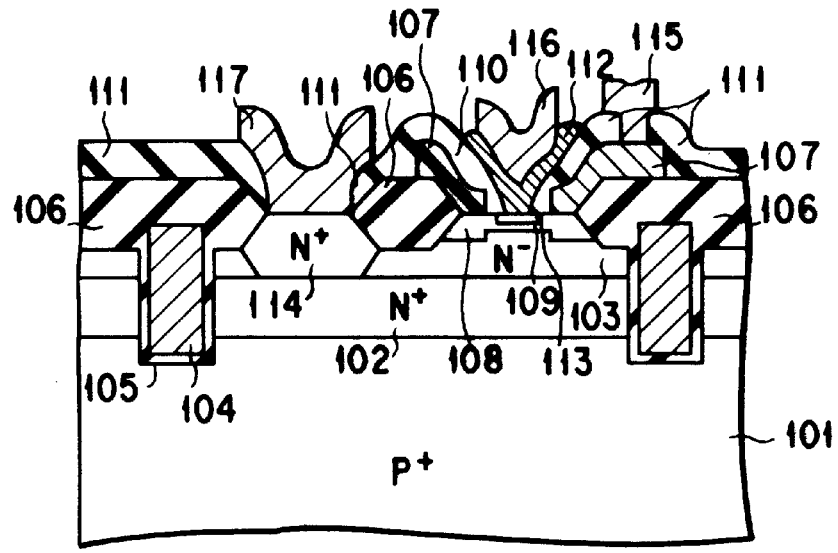
FIG. 13A is a schematic cross sectional view showing a conventional NPN transistor for explaining the prior art technique and the problem thereof.
Figure 13B:
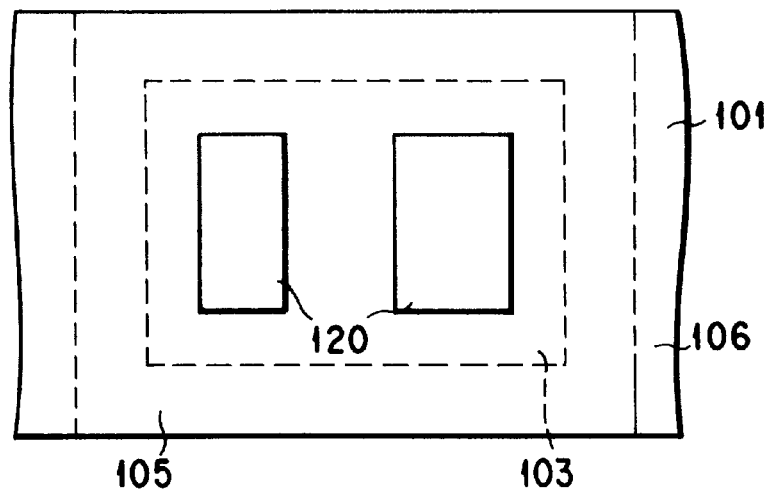
FIG. 13B is a schematic plan view showing the conventional NPN transistor shown in FIG. 13A.

Then, polysilicon is deposited to form a polysilicon layer, arsenic is ion-implanted into the polysilicon layer, and a silicon oxide film 52 is deposited. After this, the annealing process is effected to form an emitter region 49 and the patterning process is effected to form an emitter polysilicon layer 51 and collector polysilicon layer 55 (FIG. 12).

Then, an outer base region 47 is formed by self-alignment using the emitter polysilicon layer 51 and collector polysilicon layer 55 as a mask (FIG. 7). Further, a silicon oxide film is deposited and the silicon oxide film is etched to form a side wall 57 (FIG. 7).

Then, polysilicon is deposited, boron is ion-implanted into the thus formed polysilicon film, and then the polysilicon film is patterned to leave a portion thereof corresponding to the base electrode portion so as to form a base polysilicon layer 58.

Then, a protection film 53 is deposited, and portions of the thus formed protection film 53 corresponding to the base electrode portion, the emitter electrode portion and the collector electrode portion are removed by etching. Then, the wiring is made by use of aluminum, for example, to form the base electrode 59, emitter electrode 54 and collector electrode 56.

Thus, the NPN transistor having a trench isolation structure as shown in FIG. 7 is manufactured.

As described above, the magnitude of a space between the front end portion of the field oxide film on the element forming region side and the trench can be reduced.

Thus, since the field oxide film can be formed so as not to extend out the trench and extend into the element forming region, the element area can be significantly reduced. Therefore, the parasitic capacitance can be reduced and a circuit which can be operated with a low power consumption can be realized.

Further, in the above embodiments, a case wherein the electrode portions of the base, emitter and collector are formed by use of polysilicon is explained, but this is not limitative, and silicide can be used, for example, and in this case, the same effect can be expected.

Further, this invention can be variously modified without departing from the technical scope thereof.

As described above, according to this invention, a semiconductor device and a method for manufacturing the same can be provided in which the high integration density and high-speed operation can be attained by significantly reducing the element area, and the parasitic capacitance can be reduced to lower the power consumption of the circuit.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate;

an element forming region in said semiconductor substrate;

two element isolation regions in said semiconductor substrate;

two trenches located on sides of said element forming region, for electrically separating said element forming region from said element isolation regions;

a first insulation film formed on a surface of said trenches;

a conductive material filled in said trenches;

a second insulation film for element isolation extending on said trenches and said element isolation regions and not extending onto said element forming region; and a transistor formed in said element forming region, the transistor including:

a base region including an inner base region and an outer base region, an emitter region, and a collector region, each formed in the semiconductor substrate, the emitter region being in contact with a side edge portion of said second insulation film;

a base contact layer, an emitter contact layer and a collector contact layer formed on said outer base region, said emitter region and said collector region, respectively, wherein said outer base region is formed in a self alignment manner with the collector contact layer and the emitter contact layer, and said base contact layer is in a self alignment manner with insulation films formed on side walls of the collector contact layer and the emitter contact layer; and a base electrode layer, an emitter electrode layer, and a collector electrode layer formed on said base contact layer, said emitter contact layer, and said collector contact layer, respectively.

2. A semiconductor device according to claim 1, wherein said second insulation film ends at an edge of each of said trenches, each edge being adjacent an edge of said element forming region.

3. A semiconductor device according to claim 1, wherein said trenches are filled with a conductive material.

4. A semiconductor device according to claim 3, wherein said conductive material is polysilicon.

5. A semiconductor device according to claim 1, wherein said transistor is a bipolar transistor.

6. A semiconductor device according to claim 1, wherein said base contact layer, said emitter contact layer and said collector contact layer are formed of polysilicon.

7. A semiconductor device according to claim 1, wherein a lower surface of said second insulation film that extends onto the element isolation regions is substantially flat.

8. A semiconductor device according to claim 1, wherein said second insulation film ends at an edge of each of said trenches, which is adjacent to an edge of each of said trenches, which is adjacent to an edge of said element forming region, and does not extend beyond said edge of each of said trenches toward said element forming region.

* * * * *